United States Patent [19]

Watanabe

[11] Patent Number: 5,002,902

[45] Date of Patent: Mar. 26, 1991

[54] METHOD FOR FABRICATING A SEMICONDUCTOR DEVICE INCLUDING THE STEP OF FORMING AN ALIGNMENT MARK

[75] Inventor: Kiyoshi Watanabe, Yokohama, Japan

[73] Assignee: Fujitsu Limited, Kawasaki, Japan

[21] Appl. No.: 510,890

[22] Filed: Apr. 18, 1990

[51] Int. Cl.[5] .............................................. H01L 21/311

[52] U.S. Cl. ...................................... 437/235; 437/229; 437/924; 437/984; 437/195

[58] Field of Search ............... 437/195, 924, 984, 229, 437/235

[56] References Cited

U.S. PATENT DOCUMENTS

| | | | |
|---|---|---|---|
| 3,783,044 | 1/1974 | Cheskis et al. | 437/924 |
| 4,442,590 | 4/1984 | Stockton et al. | 437/924 |
| 4,487,653 | 12/1984 | Hatcher | 437/984 |
| 4,732,646 | 3/1988 | Elsner et al. | 156/643 |

FOREIGN PATENT DOCUMENTS

| | | | |
|---|---|---|---|
| 61-089633 | 5/1986 | Japan | 437/924 |
| 61-196533 | 8/1986 | Japan | 437/924 |
| 63-058828 | 3/1988 | Japan | 437/924 |

*Primary Examiner*—Olik Chaudhuri
*Assistant Examiner*—Laura M. Holtzman
*Attorney, Agent, or Firm*—Staas & Halsey

[57] ABSTRACT

A method for fabricating a semiconductor device comprises the steps of providing a first insulator layer on the top surface of a substrate so as to cover a first surface region defined on the top surface of the substrate; providing a second insulator layer on the substrate so as to cover a second surface region defined on the top surface of the substrate such that the second insulator layer further covers the first insulator layer, forming a first hole acting as an alignment mark and a second hole acting as a contact hole throughout the second insulator layer respectively in correspondence to the first surface region and the second surface region simultaneously by an etching process applied to the second insulator layer. The etching process is performed such that the etching proceeds into the first insulator layer with a first etching rate when forming the first hole and such that the etching proceeds into the substrate with a second etching rate smaller than the first etching rate when forming the second hole, and thereby the first hole penetrates into the first layer at least for a first depth and the second hole penetrates into the substrate for a second depth which is smaller than the first depth. Further a conductor material is deposited on the second insulator layer including a part of the second insulator layer corresponding to the first surface region and another part of the second insulator layer corresponding to the second surface region to form a conductor layer such that the second hole is filled by the conductor material with a substantially flat top surface being formed at a part of the conductor layer covering the second hole while the first hole is filled only partially.

8 Claims, 5 Drawing Sheets

METHOD FOR FABRICATING A SEMICONDUCTOR DEVICE INCLUDING THE STEP OF FORMING AN ALIGNMENT MARK

BACKGROUND OF THE INVENTION

The present invention generally relates to semiconductor devices and more particularly to the formation of an alignment mark on a semiconductor device for establishing an alignment of the semiconductor device with respect to a mask carrying a semiconductor pattern at the time of patterning.

The technique of multi-level interconnection is used commonly for increasing the integration density of integrated circuits. In a typical multi-level interconnection structure, a plurality of conductor layers are provided with an insulator layer provided therebetween. Contacts with the semiconductor device or contacts between the conductor layers of different levels are made by providing contact holes through the insulator layer.

FIG. 1 shows a cross-section of a typical prior art contact hole. Referring to FIG. 1, a part of a substrate or wafer 11, which may be a part of the semiconductor device formed within the substrate 11, is electrically connected to, an aluminum layer 13 via a contact hole 14 provided in an insulator layer 12 which is sandwiched between the substrate 11 and the aluminum layer 13. In the actual process of forming the structure of FIG. 1, the contact hole 14 is formed in the insulator layer 12 and the aluminum layer 13 is deposited on the insulator layer 12 including the contact hole 14 by sputtering. In such a structure, it is known that there is formed an overhang structure in the aluminum layer 13 in correspondence to the top part of the contact hole 14 as can be seen in the drawing. As a result of the formation of the overhang structure, the deposition of aluminum on the side wall of the contact hole is obstructed and there is a tendency that the aluminum layer 13 has a reduced thickness particularly at the bottom part of the side wall of the contact hole. Such a thin conductor part in the contact hole invites concentration of current which in turn tends to cause a failure of electric connection due to the electromigration effect.

In order to eliminate the formation of the overhang structure, use of bias sputtering has been proposed recently for deposition of the aluminum layer 13. According to this technique, the deposition of aluminum is made by applying an acceleration voltage as well as by heating of the substrate. As a result, the contact hole 14 is filled substantially completely with the aluminum layer 13 as shown in FIG. 2 and the foregoing problem of unreliable electrical contact is eliminated.

Meanwhile, in the fabrication of a semiconductor device on a semiconductor wafer, it is commonly practiced to provide one or more alignment marks on the wafer so that an exact alignment is achieved between the mask and the wafer at the time of patterning.

FIG. 3 shows a typical semiconductor wafer 11 on which a number of semiconductor devices 15 are formed. These semiconductor devices 15 are separated from each other on the wafer 11 by a number of scribe lines or dicing lines 16, and a number of alignment marks 17 are formed in correspondence to the dicing lines 16 so as to achieve the alignment between the wafer 11 and the mask (not shown) at the time of transferring the pattern of the semiconductor device carried by the mask on the wafer 11. These alignment marks 17 are formed generally as holes or depressions provided in correspondence to the dicing lines 16.

When the bias sputtering technique described previously is applied for depositing aluminum or other conductors on the semiconductor device 15 for multi-level interconnection, there arises a problem in that the alignment marks 17 are filled more or less completely with the deposited conductor and the detection of the marks 17 becomes difficult. When the detection of the alignment marks 17 is made erroneously or not made at all, the process of forming a new pattern on the previously patterned semiconductor device with exact alignment becomes impossible. In order to avoid this problem, it is conventionally practiced to provide the alignment marks 17 after the deposition of the conductor layer by the bias sputtering. However, such an extra step increases the number of steps in the fabrication of the semiconductor device and hence increases the cost of the semiconductor device. It should be noted that such an additional formation of the alignment mark has to be made each time a new conductor layer is provided and thus, this problem of increasing the number of steps is particularly serious when fabricating a semiconductor device having a multi-level interconnection structure.

SUMMARY OF THE INVENTION

Accordingly, it is a general object of the present invention to provide a novel and useful method for fabricating a semiconductor device including formation of an alignment mark wherein the foregoing problems are eliminated.

Another object of the present invention is to provide a method for fabricating a semiconductor device including formation of an alignment mark, wherein the alignment mark is formed as a depression such that the alignment mark is not completely filled by a conductor layer even when the conductor layer is provided so as to fill completely a contact hole used for the multi-level interconnection structure.

Another object of the present invention is to provide a method for fabricating a semiconductor device comprising a substrate defined by a top surface, said substrate being formed with an active device forming the semiconductor device, and said method comprising the steps of providing a first insulator layer on the top surface of a substrate so as to cover a first surface region defined on the top surface of the substrate, providing a second insulator layer on the substrate so as to cover a second surface region defined on the top surface of the substrate such that the second insulator layer further covers the first insulator layer, forming a first hole acting as an alignment mark and a second hole acting as a contact hole throughout the second insulator layer respectively in correspondence to the first surface region and the second surface region simultaneously by an etching process applied to the second insulator layer, said etching process being performed such that, once the first and second holes are formed throughout the second insulator layer, the etching proceeds at least into the first insulator layer with a first etching rate when forming the first hole and such that the etching proceeds into the substrate with a second etching rate smaller than the first etching rate when forming the second hole, said etching being made such that the first hole penetrates into the first layer at least for a first depth and such that the second hole penetrates into the substrate for a second depth which is smaller than the first depth, said first and second depths being determined by a ratio between the first etching rate and the second etching rate, depositing a conductor material on the second insulator layer including a part of the second insulator layer corresponding to the first surface region and another part of the second insulator layer corresponding to the second surface region to form a conductor layer such that the first hole is filled by the conductor material and a substantially flat top surface at a part of the conductor layer covering the second hole is formed. According to the present invention, the first hole acting as the alignment mark is formed always with a depth which is substantially larger than the depth of the second hole acting as the contact hole, and thus the alignment mark is not filled completely by the conductor layer even when the conductor layer is deposited such that the first hole is filled completely by the conductor layer. Thus, the alignment of the mask and the wafer can be made without any modification to the detection system used conventionally for detection of the alignment marks. Preferably, the first region is defined on the substrate in correspondence to a scribe line. The base layer may be a substrate or a conductor layer forming the multi-level interconnection structure Other objects and further features of the present invention will become apparent from the following detailed description when read in conjunction with the attached drawings.

DETAILED DESCRIPTION

FIGS. 4A–4E show a first embodiment of the present invention. This embodiment describes a process for forming a single layer interconnection structure including a step of forming the alignment mark.

Figures 4A, 4B, 4C:
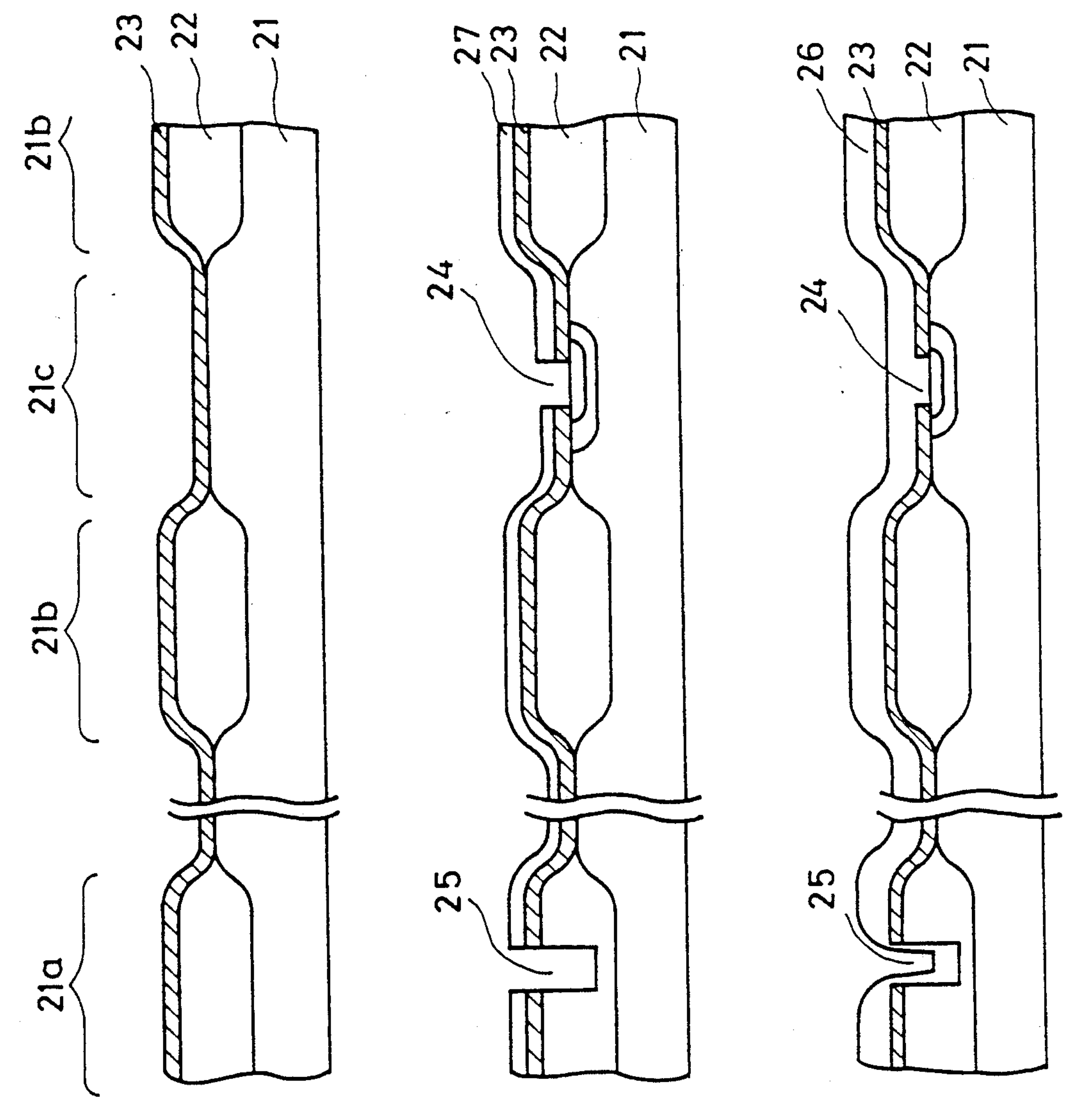
FIGS. 4A–4E are diagrams showing a first embodiment of the present invention.

Referring to the drawings, in a step shown in FIG. 4A, a field oxide layer 22 is formed on a silicon substrate 21 in correspondence to a first region 21*a* and a second region 21*b* by a well known LOCOS process thickness of about 6000 Å. The field oxide layer 22 formed in correspondence to the second region 21*b* defines a device region 21*c* in which a semiconductor device is to be formed. Further, a silicon oxide layer 23 is deposited on the structure of FIG. 4A including the first region 21*a*, second region 21*b* and the device region 21*c* to a thickness of about 4000 Å by a chemical vapor deposition process.

Next, in a step shown in FIG. 4B, a photoresist 27 is provided on the silicon oxide layer 23 and the photoresist 27 is patterned in correspondence to a contact hole 24 to be formed in the device region 21*c* and an alignment mark 25 to be formed in the first region 21*a*. Thereby, the silicon oxide layer 23 is exposed in correspondence to the contact hole 24 and the alignment mark 25. Further, the structure thus obtained is subjected to a reactive ion etching (RIE) process using a mixture of $CF_4$ and $CHF_3$ as an etching gas under a pressure of 0.15 Torr, with a radio frequency power of 450 watts. The composition of the etching gas may be chosen such that the etching gas contains $CF_4$ by 40 percent in volume and $CHF_3$ by 60 percent in volume. The RIE process applied as such provides a large first etching rate when the etching gas is reacting upon oxides such as the field oxide 22 or the silicon oxide layer 23, while the etching process provides a smaller second etching rate, which is smaller by a factor of 5 to 10 with respect to the first etching rate, when reacting upon silicon or metals such as aluminum. As a result of the difference in the etching rate, the alignment mark 25 penetrates through the silicon oxide layer 23 in correspondence to the region 21*a* and extends into the field oxide layer 22 of an overall thickness of about 9000 Å, while the contact hole 24 penetrates through the silicon oxide layer 23 and extends into the substrate 21 in correspondence to the device region 21*c* to an overall thickness of about 5000 Å. Thereby, the substrate 21 is etched for about 1000 Å but this depth of etching into the substrate in correspondence to the contact hole 24 is limited because of the reduced etching rate.

Next, in a step shown in FIG. 4C, the photoresist 27 is removed, and after a deposition of a thin barrier metal layer of TiN, not shown in the drawing, of about 1000 Å by sputtering, a conductor layer 26 of aluminum alloy containing 2% of copper is deposited further on the structure thus obtained by a bias sputtering to a thickness of about 7000 Å. The sputtering of the conductor layer 26 is performed by heating the substrate or wafer 21 to about 500° C. by a radio frequency biasing with a bias voltage of 450–500 volts. Thereby, the migration of atoms after the deposition is facilitated and the contact hole 24 is filled completely by the atoms of aluminum and copper. Thus, the conductor layer 26 shows a flat top surface in correspondence to the region of the contact hole 24, as shown in FIG. 4C.

On the other hand, the top surface of the conductor layer 26 shows a depression in correspondence to the alignment mark 25 because of t he increased depth. Thus, the depression formed on the top surface of the conductor layer 26 exactly corresponds to the position of the alignment mark 25, and an exact alignment of the mask and the substrate can be performed by detecting the depression formed in correspondence to the alignment mark 25. The detection of the depression may be performed, for example, by a conventional laser scanning combined with image processing and the like without applying any modification.

Figure 4D:
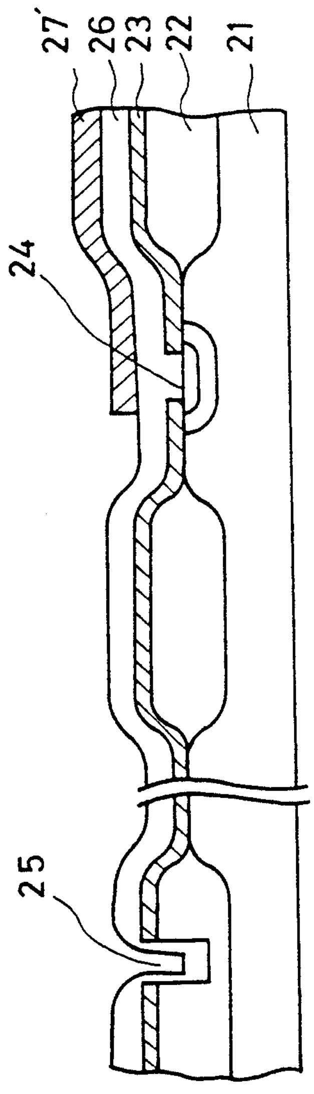

In a next step shown in FIG. 4D, a photoresist 27' is applied on the conductor layer 26 and the photoresist 27' is patterned according to a semiconductor pattern carried by a mask, which is not illustrated. During this step of patterning, the depression formed on the top surface of the conductor layer 26 in correspondence to the alignment mark 25 is used as a reference for achieving the proper alignment between the substrate 21 and the mask.

Figure 4E:
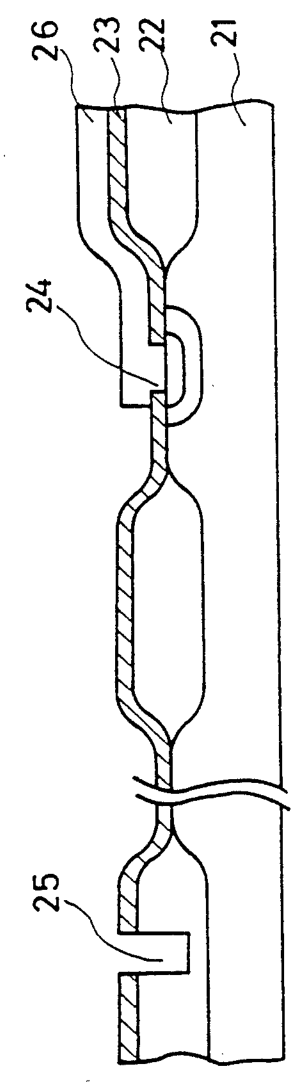

After the patterning of the photoresist 27' as shown in FIG. 4D, the conductor layer 26 is removed selectively by etching using the photoresist 27' as the mask, and the structure shown in FIG. 4E is obtained.

According to the process of the first embodiment, the advantageous feature of forming the conductor layer 26 with the flat top surface is obtained without obscuring the alignment mark 25, and thereby extra steps which otherwise would be needed to protect the alignment mark 25 such as the step of providing a mask prior to the deposition of the conductor layer 26 can be eliminated.

In the foregoing embodiment, it is assumed that the substrate 21 is already formed with diffusion regions forming the substrate in correspondence to the device region 21c where the contact hole 24 is provided. Although etching of the diffusion region in the substrate 21 occurs to some extent at the time of formation of the contact hole 24, such an etching usually does not cause undesirable deterioration or modification of the device characteristic particularly when the semiconductor device formed in the region 21c is a MOS device. In the case that the etching of the diffusion region has to be avoided as in the case of a bipolar transistor, ion implantation of impurities may be performed through the contact hole 24 followed by an annealing process, using the oxide layer 23 as a mask, after the contact hole 24 is formed by the etching. Thereby, the problem of etching of the substrate is entirely eliminated.

Next, a second embodiment of the present invention will be described with reference to FIGS. 5A-5C. In these drawings, the parts described already with reference to the preceding drawings are given identical reference numerals and the description thereof will thus be omitted.

Figures 5A, 5B, 5C:
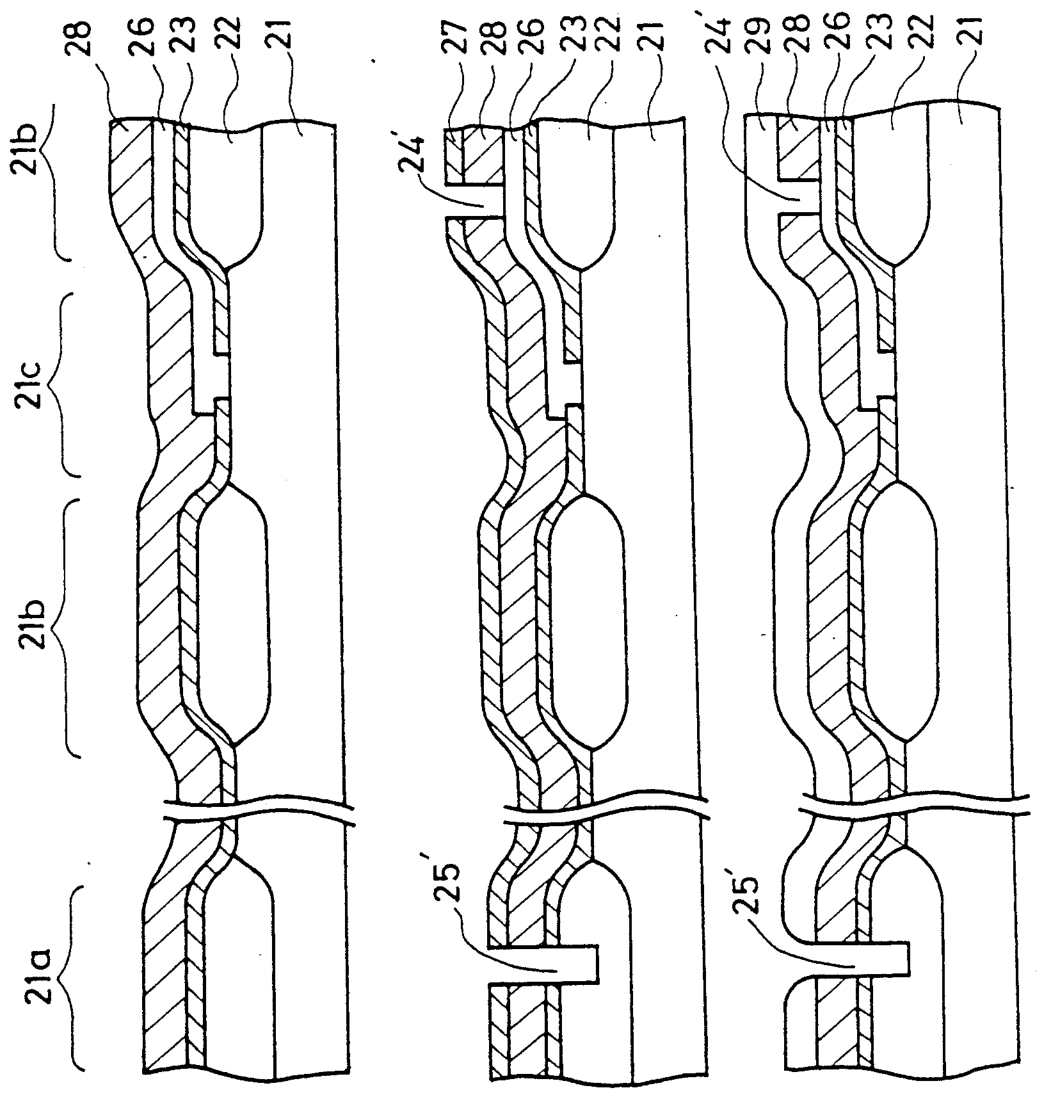
FIGS. 5A–5C are diagrams showing a second embodiment of the present invention.

In a step shown in FIG. 5A, a second silicon oxide layer 28 is deposited on the structure of FIG. 4E by CVD to a thickness of about 8000 Å. Next, a second contact hole 24' as well as a second alignment mark hole 25' are formed through the second silicon oxide layer 28 respectively in correspondence to the region 21b and the region 21a, as shown in FIG. 5B, by the etching process described previously with respect to the formation of the contact hole 24 and the alignment mark hole 25, after the deposition of a photoresist 27 and subsequent patterning thereof. These holes may be formed while using the first alignment mark 25 as a reference. It should be noted that because of the depression transferred to the second silicon oxide layer 28 in correspondence to the alignment mark 25, such an alignment of the patterning for forming the holes 24' and 25' can be made exactly with respect to the patterned semiconductor device shown in FIG. 4E. Because of the selective etching process which proceeds with different etching rates in the oxide layers and in the substrate, the hole 25' acting as the alignment mark extends throughout the second silicon oxide layer 28 and further throughout the first silicon oxide layer 23. Thereby, the hole 25' extends to a depth of about 16000 Å and reaches the field oxide layer 22 formed in correspondence to the region 21a. On the other hand, the etching for forming the contact hole 24' is substantially stopped at the conductor layer 26 because of the extremely slow etching rate of aluminum which is one-fiftieth of the etching rate of oxides.

Next, the photoresist 27 is removed and a second conductor layer 29 of the aluminum-copper alloy similar to the one forming the first conductor layer 26 is deposited on the structure thus obtained by the bias sputtering procedure which has also been described. Similarly, in the case of depositing the conductor layer 26, a TiN diffusion barrier layer not illustrated in the drawing may be deposited prior to the deposition of the conductor layer 29. As a result, the conductor layer 29 fills the contact hole substantially completely with a flat top surface. Thereby, a stable and reliable electric contact is achieved. It should be noted that, because of the depth of the alignment mark hole 25', this hole 25' appears on the top surface conductor layer 29 and thus is easily detected by the conventional detection system such as laser scanning and image processing. Thereby, the patterning of the conductor layer 29 can be performed with exact alignment with respect to the device formed underneath the conductor layer 29.

Figure 1:
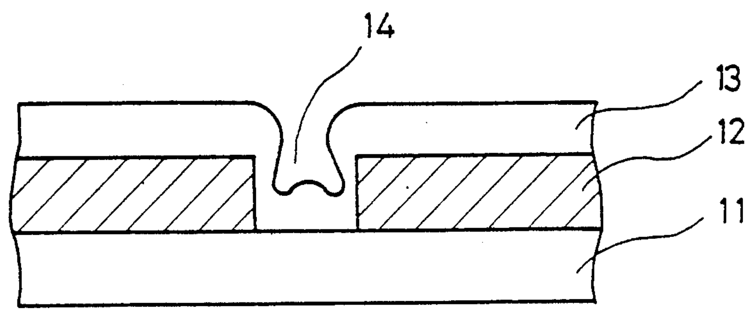
FIG. 1 is a cross sectional view showing a contact hole filled partially by a conductor forming a conductor layer according to a prior art process.
Figure 2:
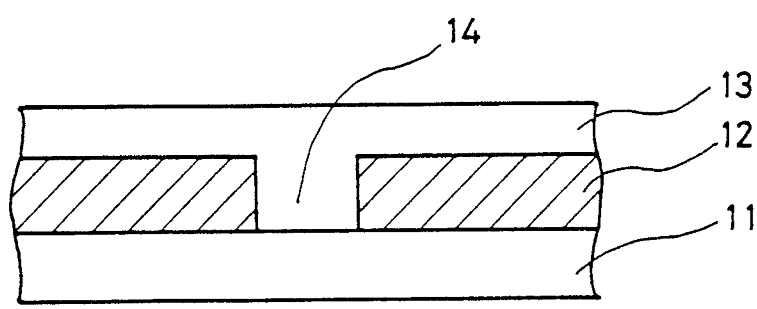
FIG. 2 is a cross sectional view showing a contact hole filled completely by a conductor forming a conductor layer according to another prior art process.
Figure 3:
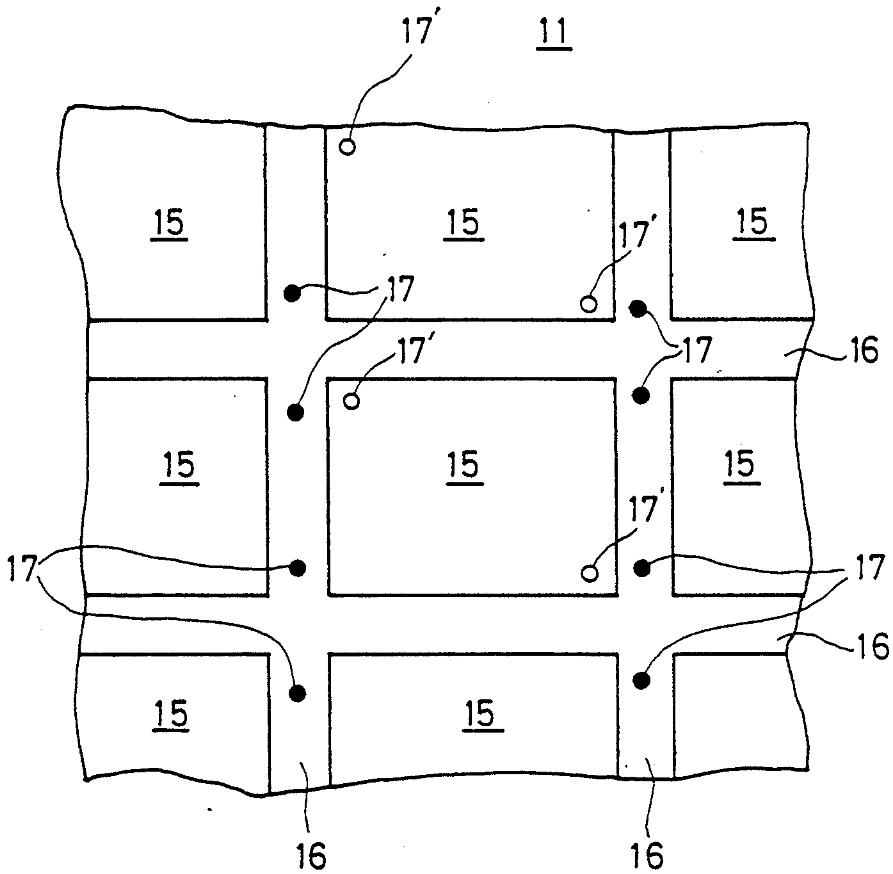
FIG. 3 is a plan view showing a part of a semiconductor wafer on which a number of semiconductor devices are formed together with alignment marks used for alignment of the wafer with respect to a mask carrying a semiconductor pattern.

Preferably, the alignment mark 25 or 25' is formed in correspondence to the scribe line 16 on the wafer as schematically illustrated in FIG. 3 by the reference numeral 17. In this case, the region 21a corresponds to the scribe line 16. Thus, when forming the alignment mark in such scribe lines 16, the field oxide layer 22 is formed in the scribe line 16 simultaneously to the formation of the field oxide layer 22 at the region 21b for defining the device region 21c. By dicing the wafer 11 after the fabrication of the semiconductor device is completed, such an alignment mark 25 or 25' is removed. Thereby, the problem that the alignment marks remaining in the integrated circuit cause an undesirable decrease in integration density is effectively avoided. Alternatively, the alignment mark 25 or 25' may be formed within the integrated circuit 15 on the waver 11 as shown in FIG. 3 by a reference numeral 17'.

Further, the present invention is not limited to these embodiments described heretofore, but instead various variations and modifications may be made without departing from the scope of the invention.

What is claimed is:

1. A method for fabricating a semiconductor device comprising a substrate defined by a top surface. said substrate being formed with an active device forming the semiconductor device, comprising the steps of:

- providing a first insulator layer on the top surface of a substrate so as to cover a first surface region defined on the top surface of the substrate;
- providing a second insulator layer on the substrate so as to cover a second, different surface region defined on the top surface of the substrate and such that the second insulator layer further covers the first insulator layer;
- forming a first hole acting as an alignment mark and a second hole acting as a contact hole, both extending through the second insulator layer and respectively in correspondence to the first surface region and the second surface region, simultaneously by an etching process applied to and through the second insulator layer;
- said etching process having a first etching rate in the material of the first and second insulator layers and a second etching rate, smaller than the first etching rate, in the material of the substrate and being performed such that, once the first and second holes are formed through second insulator layer, the etching proceeds at least into the first insulator layer at the first etching rate when forming the first hole and such that the etching proceeds into the substrate at the second etching rate and such that the first hole penetrates into the first layer at least for a first depth and such that the second hole penetrates into the substrate for a second depth which is smaller than the first depth, said first and second depths being determined by a ratio between the first etching rate and the second etching rate;

depositing a conductor material on the second insulator layer including a part of the second insulator layer corresponding to the first surface region and another part of the second insulator layer corresponding to the second surface region form a conductor layer such that second hole is filled by the conductor material with a substantially flat top surface being formed at a part of the conductor layer covering the second hole, said deposition of the conductor material being formed such that a depression is formed in the conductor layer at a part covering the first contact hole.

2. A method as claimed in claim 1 in which said substrate comprises silicon, said first surface region is defined in correspondence to a scribe line formed in the substrate, and said second surface region is defined such that the active device is formed in the substrate in correspondence to the second surface region.

3. A method as claimed in claim 2 in which said step of providing the first insulator layer comprises a step of oxidizing the first surface region of the substrate to form the first insulator layer of silicon oxide, and said step of oxidizing the substrate is performed such that a field oxide layer is formed on the top surface of the substrate so as to surround the second surface region as a result of the oxidation simultaneously with the formation of the first insulator layer.

4. A method as claimed in claim 2 in which said step of etching is performed by a reactive ion etching process, said reactive ion etching process providing the first etching rate which is about five times as large as the second etching rate.

5. A method for fabricating a semiconductor device as claimed in claim 1 in which a plurality of semiconductor chips are defined on the semiconductor substrate such that semiconductor chips are separated from each other by a plurality of scribe lines crossing each other, each of the semiconductor chips having a corner defined by a pair of crossing scribe lines, and said step of forming the first hole is performed such that the first hole is formed in the semiconductor chip in correspondence to the corner thereof.

6. A method for fabricating a semiconductor device as claimed in claim 1 in which a plurality of semiconductor chips are defined on the semiconductor substrate such that semiconductor chips are separated from each other by a scribe line, and said step of forming the first hole is performed such that the first hole is formed in the semiconductor chip in correspondence to the scribe line.

7. A method for fabricating a semiconductor device as claimed in claim 1 in which said step of depositing the material is performed by a bias sputtering process.

8. A method for fabricating a semiconductor device, said semiconductor device comprising a substrate defined by a top surface, said substrate being formed with an active device forming the semiconductor device, and said method comprising the steps of:

providing a first insulator layer on the substrate in correspondence to a first surface, region of the top surface of the semiconductor substrate where an alignment mark is to be formed and of first thickness;

providing an etching resistant layer, which is resistant to etching, in correspondence to a second surface region of the top surface separated from the first surface region;

providing a second insulator layer, on the etching resistant layer and of a second thickness which is smaller than the first thickness;

forming a first hole acting as an alignment mark and a second hole acting as a contact hole, respectively through the first insulator layer and the second insulator layer and in correspondence to the first surface region and the second surface region, by an etching process, said etching process providing a first etching rate when etching the first and second insulator layers and a second etching rate which is substantially smaller than the first etching rate when etching the etching resistant layer, said step of etching being performed until resistant layer is exposed at the second hole and whereby the first and second holes having first and second depths, respectively, the first depth is substantially larger than the second depth;

depositing a conductor material to form a conductor layer such that the conductor layer fills the second hole to a substantially flat top surface and the conductor layer forms a depression on the top surface in correspondence to the first hole.

* * * * *

UNITED STATES PATENT AND TRADEMARK OFFICE
CERTIFICATE OF CORRECTION

PATENT NO. : 5,002,902

DATED : March 26, 1991

INVENTOR(S) : WATANABE

It is certified that error appears in the above-identified patent and that said Letters Patent is hereby corrected as shown below:

On the Title Page, after section [22] insert item

--[30] Foreign Application Priority Data
April 18, 1989 [JP] Japan.....01-98101--

Col. 3, line 24, after "structure" insert --.--;
line 55, after "process" insert --to a--.
Col. 4, line 45, change "t he" to --the--.
* Col. 6, line 26, change "waver" to --wafer--.
Col. 7, line 5, after "region" insert --to--.
Col. 8, line 13, after "substrate" insert --,--;
line 38, change "having" to --have--;
line 39, after "respectively" insert --and--.

Signed and Sealed this

Twenty-ninth Day of June, 1993

Attest:

Michael K. Kirk

MICHAEL K. KIRK

*Attesting Officer*

*Acting Commissioner of Patents and Trademarks*